(12) United States Patent
Tsunashima et al.

(10) Patent No.: US 11,581,358 B2
(45) Date of Patent: Feb. 14, 2023

(54) OPTICAL SENSOR DEVICE

(71) Applicant: Japan Display Inc., Minato-ku (JP)

(72) Inventors: Takanori Tsunashima, Tokyo (JP); Masashi Tsubuku, Tokyo (JP); Makoto Uchida, Tokyo (JP)

(73) Assignee: Japan Display Inc., Tokyo (JP)

( * ) Notice: Subject to any disclaimer, the term of this patent is extended or adjusted under 35 U.S.C. 154(b) by 280 days.

(21) Appl. No.: 16/999,214

(22) Filed: Aug. 21, 2020

(65) Prior Publication Data

US 2020/0381472 A1 Dec. 3, 2020

Related U.S. Application Data

(63) Continuation of application No. PCT/JP2019/000802, filed on Jan. 11, 2019.

(30) Foreign Application Priority Data

Feb. 28, 2018 (JP) .............................. JP2018-035701

(51) Int. Cl.
*H01L 27/146* (2006.01)
*H01L 31/032* (2006.01)
(Continued)

(52) U.S. Cl.
CPC .. *H01L 27/14643* (2013.01); *H01L 27/14603* (2013.01); *H01L 27/14623* (2013.01);
(Continued)

(58) Field of Classification Search
CPC ......... H01L 27/14643; H01L 27/14603; H01L 27/14623; H01L 31/032; H01L 31/1136;
(Continued)

(56) References Cited

U.S. PATENT DOCUMENTS 6,407,393 B1 * 6/2002 Kim .................. H01L 27/14603
257/E27.113
2010/0320514 A1 * 12/2010 Tredwell ........... H01L 27/14692
257/443
(Continued)

FOREIGN PATENT DOCUMENTS

JP 4-366924 A 12/1992
JP 6-140614 A 5/1994
(Continued)

OTHER PUBLICATIONS

International Search Report dated Apr. 2, 2019 in PCT/JP2019/000802 filed Jan. 11, 2019, 2 pages

*Primary Examiner* — Allen L Parker
*Assistant Examiner* — David W Houston, III
(74) *Attorney, Agent, or Firm* — Maier & Maier, PLLC

(57) ABSTRACT

According to one embodiment, an optical sensor device includes an insulating substrate, a first conductive layer and an optical sensor element disposed between the insulating substrate and the first conductive layer. The optical sensor element is electrically connected to the first conductive layer and covered by the first conductive layer. The optical sensor element includes a first semiconductor layer formed of an oxide semiconductor and controls an amount of charge flowing to the first conductive layer according to an amount of incident light to the first semiconductor layer.

8 Claims, 5 Drawing Sheets

(51) Int. Cl.
 *H01L 31/113* (2006.01)
 *H04N 5/369* (2011.01)
(52) U.S. Cl.
 CPC ........ *H01L 31/032* (2013.01); *H01L 31/1136* (2013.01); *H04N 5/379* (2018.08)
(58) Field of Classification Search
 CPC .............. H01L 27/1225; H01L 29/242; H01L 29/7869; H01L 2924/1067; H01L 27/14665; H01L 29/786; H01L 27/14612; H01L 27/146; H01L 31/113; H04N 5/379; H04N 5/374
 USPC .......................................................... 257/43
 See application file for complete search history.

(56) References Cited

U.S. PATENT DOCUMENTS

| | | | | |
|---|---|---|---|---|
| 2011/0266599 | A1* | 11/2011 | Ishida | H01L 27/14658 257/292 |
| 2011/0284722 | A1* | 11/2011 | Ahn | H03K 17/78 250/214 R |
| 2017/0047449 | A1* | 2/2017 | Takechi | H01L 27/14689 |
| 2017/0358622 | A1* | 12/2017 | Kanesada | H01L 27/1463 |

FOREIGN PATENT DOCUMENTS

| | | | | | |
|---|---|---|---|---|---|
| JP | 10-285466 | A | | 10/1998 | |
| JP | 4366924 | B2 * | 11/2009 | ............. H01L 27/12 |
| JP | 2010-165744 | A | | 7/2010 | |
| JP | 2011-35223 | A | | 2/2011 | |
| JP | 2011-243950 | A | | 12/2011 | |
| JP | 6140614 | B2 * | 5/2017 | ........... C07K 14/005 |

\* cited by examiner

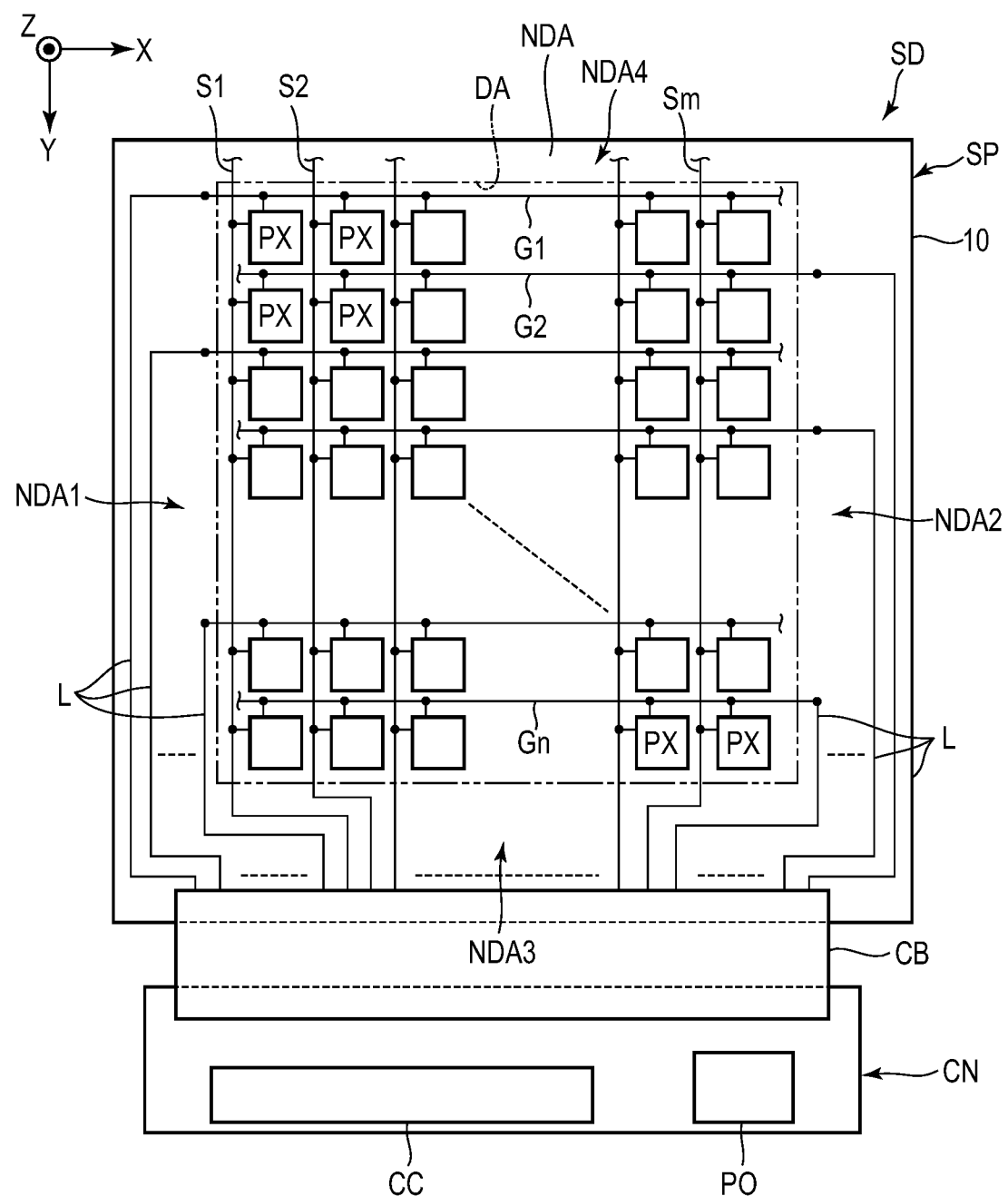
F I G. 1

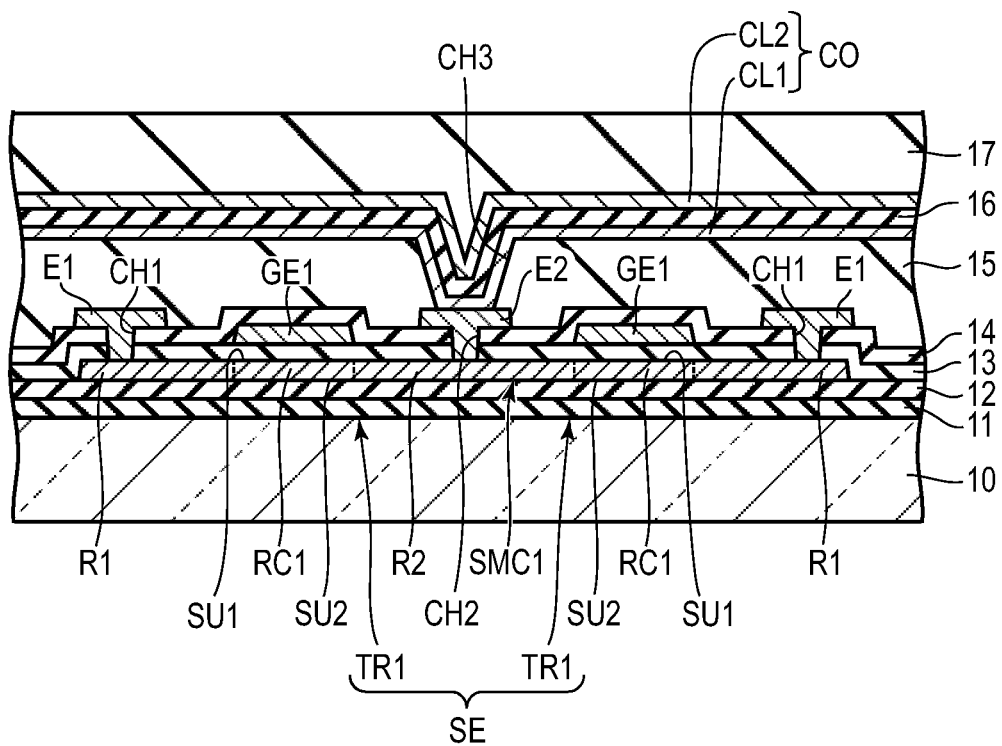
F I G. 4
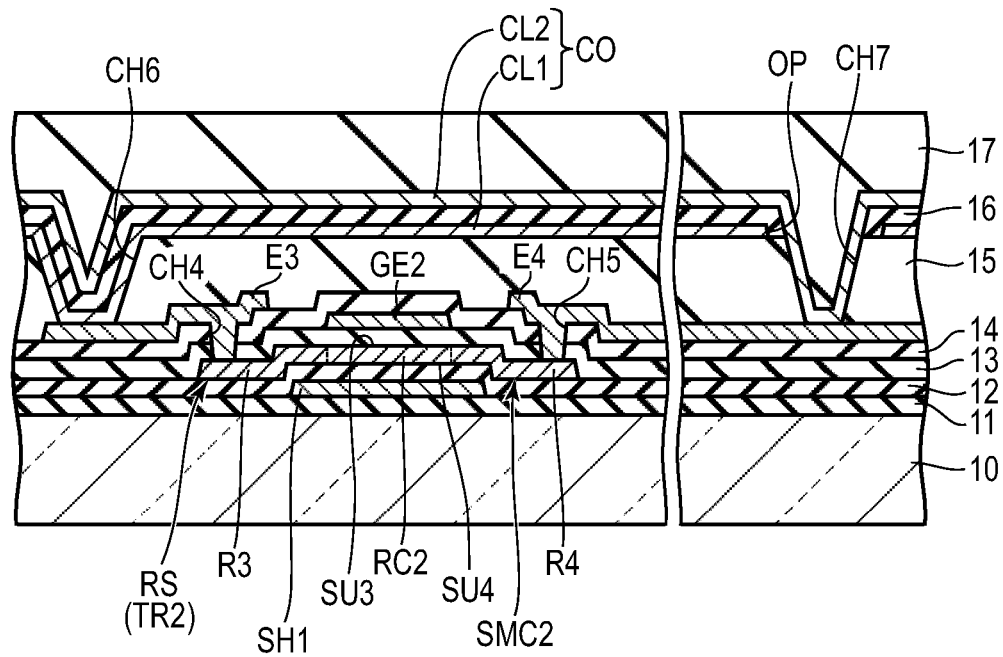
F I G. 5

OPTICAL SENSOR DEVICE

CROSS-REFERENCE TO RELATED APPLICATIONS

This application is a Continuation Application of PCT Application No. PCT/JP2019/000802, filed Jan. 11, 2019 and based upon and claiming the benefit of priority from Japanese Patent Application No. 2018-035701, filed Feb. 28, 2018, the entire contents of all of which are incorporated herein by reference.

FIELD

Embodiments described herein relate generally to an optical sensor device.

BACKGROUND

As an example of the optical sensor devices, the CMOS image sensor is conventionally known. The CMOS image sensor comprises a plurality of regions. The CMOS image sensor comprises a semiconductor layer formed of polycrystalline silicon. Since the CMOS image sensor is not suitable for lowering the definition or increasing the area of the regions, a further optical system needs to be used to condense light in the regions of the CMOS image sensor when used.

BRIEF DESCRIPTION OF THE DRAWINGS

FIG. 1 is a circuit diagram showing an optical sensor device according to one embodiment.

FIG. 4 is a cross-section showing the optical sensor device of FIG. 3, taken along a line IV-IV.

FIG. 5 is a cross-section showing the optical sensor device of FIG. 3, taken along a line V-V.

DETAILED DESCRIPTION

Figure 2:
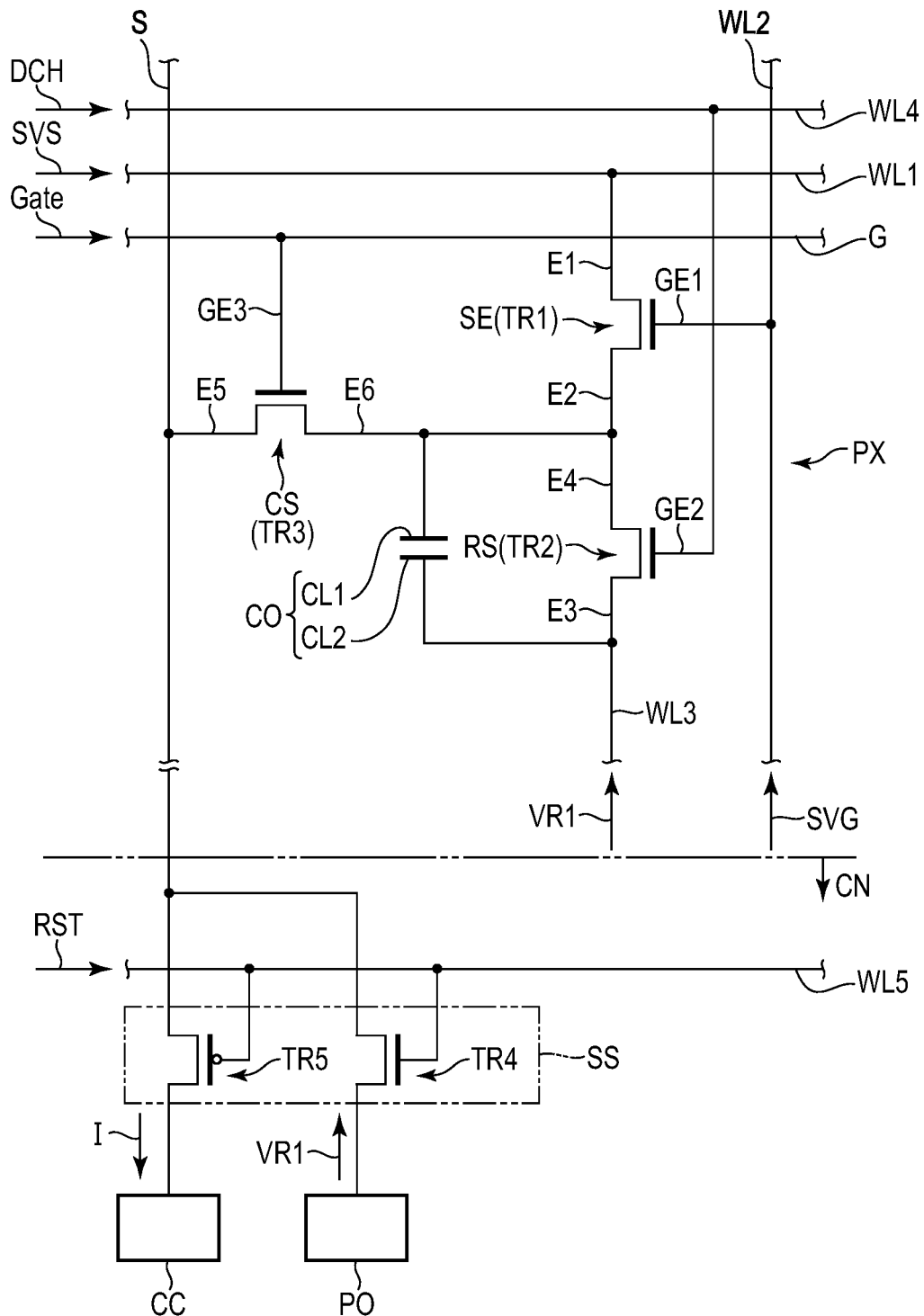
FIG. 2 is an equivalent circuit diagram showing a region shown in FIG. 1, together with a control circuit, a power circuit and a selection switch, also shown in FIG. 1.

In general, according to one embodiment, there is provided an optical sensor device comprising an insulating substrate, an optical sensor element including a first gate electrode, a first semiconductor layer, a first electrode and a second electrode, a first insulating layer disposed between the first gate electrode and the first semiconductor layer, a second insulating layer disposed above the first gate electrode, the first semiconductor layer and the first insulating layer, a third insulating layer disposed on the second insulating layer, the first electrode and the second electrode, and a first conductive layer covering the optical sensor element. The first gate electrode is formed above the insulating substrate. The first semiconductor layer is formed of an oxide semiconductor and includes a first region, a second region and a first channel region located between the first region and the second region. The first channel region includes a first main surface opposing the first gate electrode and a second main surface at an opposite side of the first main surface. An electrical resistivity of the first channel region changes according to an amount of light received by the second main surface. The first electrode is located on the second insulating layer, and electrically connected to the first region through a first contact hole penetrating the second insulating layer and located in a region opposing the first region. The second electrode is located on the second insulating layer and electrically connected to the second region through a second contact hole penetrating the second insulating layer and located in a region opposing the second region. The first conductive layer is disposed above the third insulating layer and electrically connected to the second electrode through a third contact hole penetrating the third insulating layer and located in a region opposing the second electrode.

According to another embodiment, there is provided an optical sensor device comprising an insulating substrate, a first conductive layer disposed above the insulating substrate, and an optical sensor element disposed between the insulating substrate and the first conductive layer, electrically connected to the first conductive layer, covered by the first conductive layer, including a first semiconductor layer formed of an oxide semiconductor, and controlling an amount of charge flowing to the first conductive layer according to an amount of incident light.

According to another embodiment, there is provided an optical sensor device comprising an insulating substrate, and a plurality of regions arrayed in a matrix above the insulating substrate. Each of the plurality of regions comprises a first conductive layer disposed above the insulating substrate, and an optical sensor element disposed between the insulating substrate and the first conductive layer, electrically connected to the first conductive layer, covered by the first conductive layer, including a first semiconductor layer formed of an oxide semiconductor, and controlling an amount of charge flowing to the first conductive layer according to an amount of incident light to the first semiconductor layer.

An embodiment will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

FIG. 1 is a circuit diagram showing an optical sensor device SD of an embodiment. A first direction X, a second direction Y and a third direction Z are orthogonal to each other, but may intersect at an angle other than 90°. The first direction X and the second direction Y correspond to the directions parallel to the main surface of a substrate which constitutes the optical sensor device SD, and the third direction Z corresponds to the thickness direction of the optical sensor device SD.

As shown in FIG. 1, the optical sensor device SD comprises an optical sensor panel SP, a control unit CN and a wiring substrate CB. The wiring substrate CB is, for example, a flexible printed circuit (FPC), and connects the control unit CN and the optical sensor panel SP to each other. The control unit CN includes a control circuit CC and a power circuit PO.

The optical sensor panel SP comprises an insulating substrate 10, a plurality of regions PX, a plurality of gate lines G (G1, G2, . . . , Gn), a plurality of source lines S (S1, S2, . . . , Sm), and the like. The insulating substrate 10 is formed of an insulation material such as glass or resin. Further, in this embodiment, the insulating substrate 10 is formed of a transparent insulation material. The insulating substrate 10 comprises a detection area DA to detect an object and a non-detection area NDA of outside of the detection area DA. The non-detection area NDA includes a belt-shaped first non-detection area NDA1 located on a left-hand side of the detection area DA and extending along the second direction Y, a belt-shaped second non-detection area NDA2 located on a right-hand side of the detection area DA and extending along the second direction Y, a belt-shaped third non-detection area NDA3 located on a lower side of the detection area DA and extending along the first direction X and a belt-shaped fourth non-detection area NDA4 located on an upper side of the detection area DA and extending along the first direction X. A plurality of regions PX are disposed on the detection area DA of the insulating substrate 10 in a matrix along the first direction X and the second direction Y.

The plurality of gate lines G are arranged to extend in the first direction X and to be spaced apart from each other in the second direction Y in the detection area DA. Each gate line G is connected to a plurality of regions PX of one row in the first direction X. In this embodiment, a plurality of gate lines G of odd-numbered rows are each connected to lead wires L extending in the first non-detection area NDA1 and the third non-detection area NDA3, respectively, on an outer side of the detection area DA. A plurality of gate lines G of even-numbered rows are connected to lead wires L extending in the second non-detection area NDA2 and the third non-detection area NDA3, respectively, on an outer side of the detection area DA. Each lead wire L is connected to the wiring substrate CB. With the structure described above, each gate line G is connected to the control circuit CC via the respective lead wire L, the wiring substrate CB and the like.

A plurality of source lines S are arranged to extend along the second direction Y and to be spaced apart from each other along the first direction X in the detection area DA. Each source line S is connected to a plurality of regions PX of one column in the second direction Y. In this embodiment, each source line S is routed in the third non-detection area NDA3 and connected to the wiring substrate CB outside the detection area DA.

Next, among the regions PX, one region PX will be described as a typical example. Note that these regions PX have configurations similar to each other. FIG. 2 is an equivalent circuit showing a region PX shown in FIG. 1, illustrated along with a control circuit CC, a power circuit PO and a selection switch SS, shown in FIG. 1.

As seen in FIG. 2, the region PX comprises a optical sensor element SE, a capacitor CO, a reset switch RS and a control switch CS. On the insulating substrate 10 shown in FIG. 1, not only the gate lines G and the source lines S, but also a first control wiring line WL1, a second control wiring line WL2, a third control wiring line WL3 and a fourth control wiring line WL4 are also disposed.

FIG. 2 shows an example in which an optical sensor element SE is constituted by one first thin film transistor TR1 for the sake of convenience. As will be described below, the optical sensor element SE of this embodiment is constituted by a plurality of first thin film transistors TR1 connected in parallel with each other. Note that, the optical sensor element SE may be constituted by one first thin film transistor TR1 unlike this embodiment.

The first thin film transistor TR1 includes a first gate electrode GE1, a first electrode E1 and a second electrode E2. The first gate electrode GE1 is connected to the second control wiring line WL2, and the first electrode E1 is connected to the first control wiring line WL1. The first thin film transistor TR1 is turned on or off in reply to a control signal SVG to be applied via the second control wiring line WL2.

The capacitor CO includes a first conductive layer CL1 and a second conductive layer CL2. The first conductive layer CL1 is connected to the second electrode E2, and the second conductive layer CL2 is connected to the third control wiring line WL3.

The reset switch RS is constituted by a second thin film transistor TR2. The second thin film transistor TR2 includes a second gate electrode GE2, a third electrode E3 and a fourth electrode E4. The second gate electrode GE2 is connected to the fourth control wiring line WL4. The third electrode E3 is connected to the third control wiring line WL3 and the second conductive layer CL2. The fourth electrode E4 is connected to the second electrode E2 and the first conductive layer CL1. The second thin film transistor TR2 is turned on or off in reply to the control signal DCH to be applied via the fourth control wiring line WL4.

The control switch CS is constituted by the third thin film transistor TR3. The third thin film transistor TR3 includes a third gate electrode GE3, a fifth electrode E5 and a sixth electrode E6. The third gate electrode GE3 is connected to a gate line G, and the fifth electrode E5 is connected to a source line S. The sixth electrode E6 is connected to the second electrode E2, the fourth electrode E4 and the first conductive layer CL1. The third thin film transistor TR3 is turned on or off in reply to a control signal Gate to be applied via the respective gate line G.

The control unit CN also includes the selection switch SS and the fifth control wiring line WL5 as well in addition to the control circuit CC and the power circuit PO. The selection switch SS includes a fourth thin film transistor TR4 and a fifth thin film transistor TR5. In this embodiment, the first thin film transistor TR1 to the fourth thin film transistor TR4 are N-channel thin-film transistors, whereas the fifth thin film transistor TR5 is a P-channel thin-film transistor.

The fourth thin film transistor TR4 is connected between the source line S and the power circuit PO. The fifth thin film transistor TR5 is connected between the source line S and the control circuit CC. The fourth thin film transistor TR4 and the fifth thin film transistor TR5 are turned on or off according to control signals RST to be applied via the fifth control wiring line WL5, respectively.

When the fourth thin film transistor TR4 is on and the fifth thin film transistor TR5 is off, the selection switch SS applies a reset signal VR1 to the optical sensor element SE from the power circuit PO via the source line S and the control switch CS. On the other hand, when the fourth thin film transistor TR4 is off whereas the fifth thin film transistor TR5 is on, the selection switch SS opens to discharge from the capacitor CO to the control circuit CC via the control switch CS and the source line S. Thus, a current I flows to the control circuit CC from the capacitor CO.

When the optical sensor element SE is turned on, the optical sensor element SE is reset by a reset signal VR1 to be applied via the control switch CS. On the other hand, when the optical sensor element SE is off, the optical sensor element SE controls the amount of charge flowing to the first conductive layer CL1 according to the amount of the incident light to the first semiconductor layers SMC1. In other words, the optical sensor element SE control the amount of the portion of the control signal SVS applied via the first control wiring line WL1 to the first electrode E1, which is applied to the first conductive layer CL1, according to the amount of the incident light to the first semiconductor layers SMC1. Thus, the optical sensor element SE controls the amount of charge stored on the capacitor CO according to the amount of the incident light to the first semiconductor layers SMC1.

When the reset switch RS is turned on, the reset switch RS connects the first conductive layer CL1 and the second conductive layer CL2 to short-circuit. Note that to the third electrode E3 of the reset switch RS, the reset signal VR1 is applied. The reset signal VR1 is a constant-potential voltage signal. When the reset switch RS is off, the reset switch RS maintains an original function of the capacitor CO. Thus, the capacitor CO is reset when the reset switch RS is turned on.

When the control switch CS is turned on, the control switch CS switches between whether or not the reset signal VR1 is applied to the optical sensor element SE. Further, when the control switch CS is turned on, the control switch CS switches between whether or not to discharge from the capacitor CO to the control circuit CC.

Figure 3:
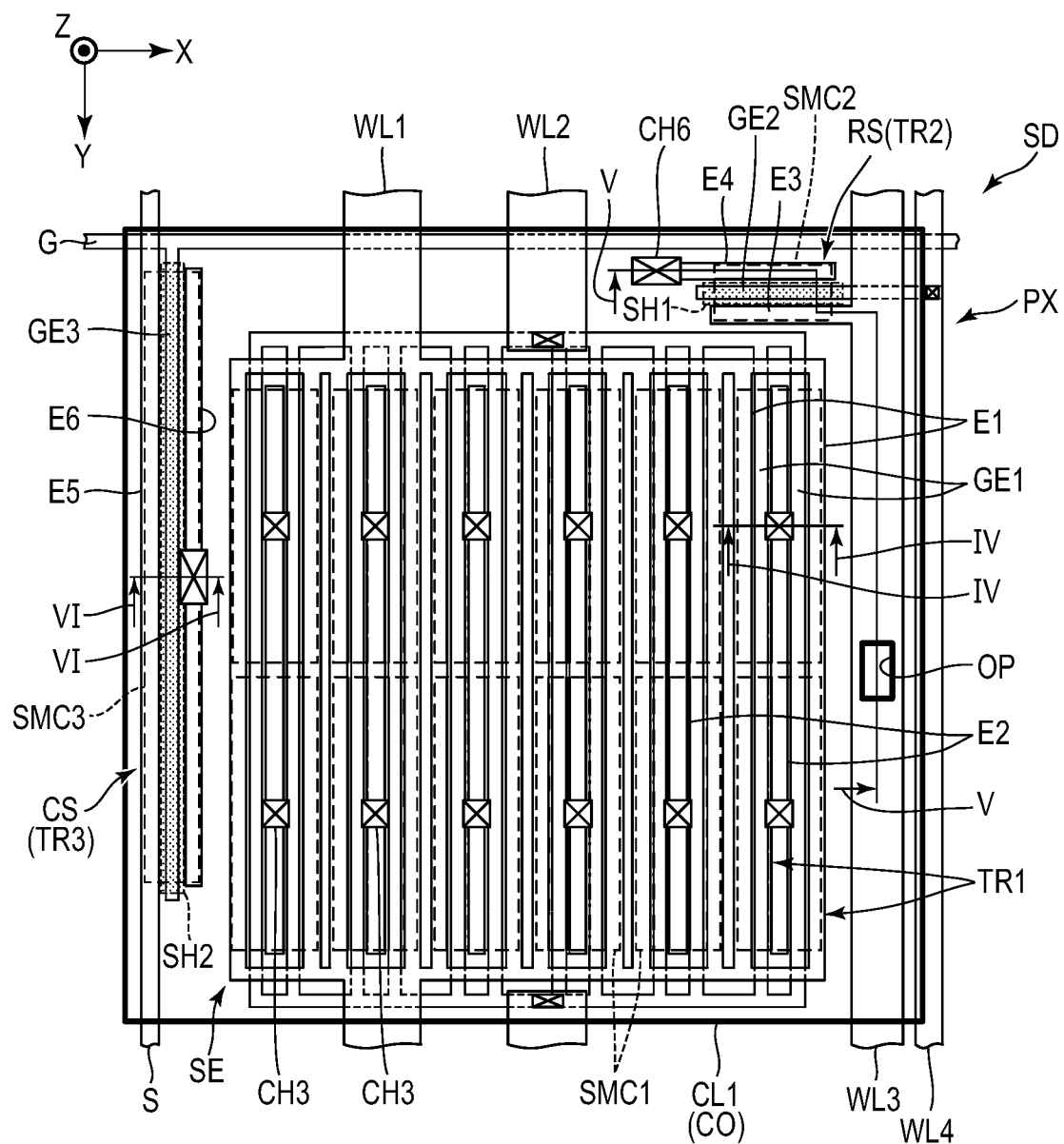
FIG. 3 is a plan view showing the region.

FIG. 3 is a plan view showing a region PX shown in FIG. 2. Note that, in FIG. 3, the illustration of the second conductive layer CL2 is omitted.

As shown in FIG. 3, the first conductive layer CL1 (the capacitor CO) covers the optical sensor element SE, the reset switch RS and the control switch CS. The first conductive layer CL1 functions as a common node of the optical sensor element SE, the reset switch RS and the control switch CS. Therefore, as compared to the case where the first conductive layer CL1 does not function as the node, the area efficiency of the optical sensor element SE, the reset switch RS and the control switch CS in the region PX can be improved. For example, the wiring to connect the optical sensor element SE, the reset switch RS and the control switch CS to each other can be reduced, and the area where the optical sensor element SE or the like is to be placed can be largely reserved.

Of the optical sensor element SE, the reset switch RS and the control switch CS, the area exclusively occupied by the optical sensor element SE is the largest. For example, the optical sensor element SE occupies 50% or more of the range opposing to the first conductive layer CL1. Therefore, a high-sensitivity optical sensor element SE can be obtained.

The optical sensor element SE includes stripe-shaped first electrodes E1 which extend, for example, in the second direction Y and are arranged to be spaced apart from each other in the first direction X. The first electrodes E1 are electrically bundled and are connected to the first control wiring line WL1. In this embodiment, the first electrode E1 and the first control wiring line WL1 are formed integrally as one body.

The optical sensor element SE includes a plurality of second electrodes E2. The second electrodes E2 each extend in the second direction Y and are each located between respective adjacent pair of first electrodes E1. In the example illustrated, an upper-side second electrode E2 and a lower-side second electrode E2 are located apart from each other by an insulation distance, in a region between a respective adjacent pair of first electrodes E1. The second electrodes E2 are each connected to the first conductive layer CL1. In the example illustrated, the optical sensor element SE comprise twenty four first thin film transistors TR1 connected in parallel.

The optical sensor element SE includes stripe-shaped first gate electrodes GE1 which extend, for example, in the second direction Y and are arranged to be spaced apart from each other in the first direction X. The first gate electrodes GE1 are electrically bundled and are connected to the second control wiring line WL2.

The optical sensor element SE includes, for example, a plurality of first semiconductor layers SMC1. As viewed along the second direction Y, two first semiconductor layers SMC1 are arranged to be physically independent from each other. Note here that three or more first semiconductor layers SMC1 may be arranged to be physically independent from each other in the second direction Y, or a single first semiconductor layer SMC1 may extend continually in the second direction Y, unlike the present embodiment. In other words, the first semiconductor layer SMC1 need not necessarily be divided into multiple in the second direction Y.

In the reset switch RS, the third electrode E3 extends, for example, in the first direction X, and is formed to be integrated as one body with the third control wiring line WL3 extending in the second direction Y. The fourth electrode E4 extends, for example, in the first direction X and is connected to the first conductive layer CL1. The second gate electrode GE2 extends in the first direction X so as to be located between the third electrode E3 and the fourth electrode E4, and is electrically connected to the fourth control wiring line WL4 extending in the second direction Y. A first light-shielding layer SH1 is provided to oppose the second gate electrode GE2 and extend along the second gate electrode GE2.

In the control switch CS, the fifth electrode E5 extends, for example, in the second direction Y and is formed to be integrated as one body with the source line S extending in the second direction Y. The sixth electrode E6 extends, for example, in the second direction Y and is connected to the first conductive layer CL1. The third gate electrode GE3 extends in the second direction Y so as to be located between the fifth electrode E5 and the sixth electrode E6 and is formed to be integrated as one body with the respective gate line G extending in the first direction X. A second light-shielding layer SH2 is provided to oppose the third gate electrode GE3 and extend along the third gate electrode GE3.

The third semiconductor layer SMC3 of the control switch CS extends continually in the second direction Y. Note here that the control switch CS may include a plurality of third semiconductor layers SMC3 arranged to be physically independent from each other in the second direction Y, unlike the present embodiment.

The first light-shielding layer SH1 and the second light-shielding layer SH2 are formed of the same material. The gate lines G, the first gate electrode GE1, the second gate electrode GE2 and the third gate electrode GE3 are formed of the same material. The first electrode E1 to the sixth electrode E6, the source lines S and the first control wiring line WL1 to the fourth control wiring line WL4 are formed of the same material.

Next, a cross-sectional structure of each of the optical sensor element SE and the capacitor CO will be described. FIG. 4 is a cross-section of the optical sensor device SD shown in FIG. 3, taken along a line IV-IV.

As shown in FIG. 4, a glass substrate can be used as the insulating substrate 10. Note that some other substrate than the glass substrate may be used for the insulating substrate 10. For example, the insulating substrate 10 may be a resin substrate. Further, the insulating substrate 10 may be light-transmissive as needed. Above the insulating substrate 10, the optical sensor element SE including the first gate electrode GE1, the first semiconductor layer SMC1, the first electrode E1 and the second electrode E2, is located. The optical sensor element SE is constituted by a plurality of first thin film transistors TR1, and each of the first thin film transistors TR1 includes the first gate electrode GE1, the first semiconductor layer SMC1, the first electrode E1 and the second electrode E2. Above the optical sensor element SE, the capacitor CO including the first conductive layer CL1 and the second conductive layer CL2 is located.

The insulating layer 11 is disposed on the insulating substrate 10 and is in contact with the insulating substrate 10. The insulating layer 12 is disposed on the insulating layer 11 and is in contact with the insulating layer 11. The first gate electrode GE1 is disposed above the insulating substrate 10. The insulating layer 13 is disposed between the first gate electrode GE1 and the first semiconductor layer SMC1. The insulating layer 14 is disposed above the first gate electrode GE1, the first semiconductor layer SMC1 and the first insulating layer 13. The insulating layer 15 is disposed on the insulating layer 14, the first electrode E1 and the second electrode E2.

The first semiconductor layer SMC1 is formed of an oxide semiconductor. Typical examples of the oxide semiconductor are indium-gallium-zinc oxide (IGZO), indium-gallium oxide (IGO), indium-zinc oxide (IZO), zinc-tin oxide (ZnSnO), zinc oxide (ZnO) and transparent amorphous oxide semiconductor (TAOS). In this embodiment, the first semiconductor layer SMC1 is formed of TAOS.

When an oxide semiconductor as described above is used, the first thin film transistor TR1 can suppress the current (leak current) in a dark condition to low, thereby achieving a great signal-to-noise ratio.

The first semiconductor layer SMC1 includes a first region R1, a second region R2 and a first channel region RC1 located between the first region R1 and second region R2. The first channel region RC1 includes a first main surface SU1 opposing the first gate electrode GE1 and a second main surface SU2 at an opposite side of the first main surface SU1. The first channel region RC1 changes its electrical resistivity according to the amount of light received by the second main surface SU2.

The second main surface SU2 of this embodiment is located to oppose the insulating substrate 10. On the second main surface SU2, the light transmitted through the insulating substrate 10 is made incident. Therefore, the insulating substrate 10 of the embodiment is light-transmissive.

The first electrode E1 is disposed on the insulating layer 14. The first electrode E1 passes through a first contact hole CH1 formed to penetrate at least the insulating layer 14 and located in a region opposing the first region R1, and is electrically connected to the first region R1. In this embodiment, the first contact hole CH1 penetrates the insulating layer 13 and the insulating layer 14.

The second electrode E2 is disposed on the insulating layer 14. The second electrode E2 passes through a second contact hole CH2 formed to penetrate at least the insulating layer 14 and located in a region opposing the second region R2, and is electrically connected to the second region R2. In this embodiment, the second contact hole CH2 penetrates the insulating layer 13 and the insulating layer 14.

The first conductive layer CL1 is disposed above the insulating layer 15 so as to cover the optical sensor element SE. In this embodiment, the first conductive layer CL1 is in contact with the insulating layer 15. The first conductive layer CL1 passes through a third contact hole CH3 formed to penetrate at least the insulating layer 15 and located in a region opposing the second electrode E2, and is electrically connected to the second electrode E2. In this embodiment, the third contact hole CH3 penetrates only the insulating layer 15.

Note that in the insulating layer 15, a plurality of holes similarly configured as the third contact hole CH3 are formed (see FIG. 3). The number of the third contact holes CH3 is equal to or more than the number of the second electrodes E2. With the above-described structure, the first conductive layer CL1 passes through a corresponding one of the third contact holes CH3, and is electrically connected to the second electrode E2 of each of the first thin film transistors TR1.

The insulating layer 16 is disposed on the insulating layer 15 and the first conductive layer CL1, and is in contact with the insulating layer 15 and the first conductive layer CL1. The second conductive layer CL2 opposes the first conductive layer CL1. Though not illustrated entirely, the second conductive layer CL2 opposes a plurality of first conductive layers CL1. Note that the insulating layer 16 is disposed between the first conductive layer CL1 and the second conductive layer CL2. The first conductive layer CL1 is disposed between the insulating layer 15 and the second conductive layer CL2. With this structure, the second conductive layer CL2 can avoid such a situation that the first conductive layer CL1 is affected by an adverse electrical effect from outside such as static electricity or the like.

The insulating layer 17 is disposed on the insulating layer 16 and the second conductive layer CL2, and is in contact with the insulating layer 16 and the second conductive layer CL2.

The first gate electrode GE1, the first electrode E1 and the second electrode E2 are formed of, for example, molybdenum, chrome, tungsten, aluminum, copper, titanium, nickel, tantalum, silver or an alloy of any of these, but the material is not limited to those listed. Some other metals, alloys or laminated films thereof may as well be used.

The first conductive layer CL1 and the second conductive layer CL2 are formed of a light-transmissive conductive material such as ITO or the like. Therefore, the optical sensor panel SP can be formed by a production method similar to that of the fringe field switching (FFS) mode liquid-crystal display panel. Note that the first conductive layer CL1 and the second conductive layer CL2 may be formed of a light-shielding conductive material such as a metal or the like. This is because the optical sensor element SE is to detect the light transmitted through the insulating substrate 10.

The insulating layer 11, insulating layer 12, insulating layer 13, insulating layer 14 and insulating layer 16 are formed of an inorganic insulating layer of silicon oxide or silicon nitride or the like, or a multi-layer thereof. The insulating layer 15 and the insulating layer 17 are formed from an organic insulating layer.

Next, a cross-sectional structure of each of the reset switch RS and the capacitor CO will be described. FIG. 5 is a cross-section of the optical sensor device SD shown in FIG. 3, taken along a line V-V.

As shown in FIG. 5, above the insulating substrate 10, the reset switch RS including the second gate electrode GE2, the second semiconductor layer SMC2, the third electrode E3 and the fourth electrode E4 is located. The reset switch RS is constituted by the second thin film transistor TR2. Above the reset switch RS, the capacitor CO is located.

The insulating layer 12 is located between the first light-shielding layer SH1 and the second semiconductor layer SMC2. The second gate electrode GE2 is formed above the insulating substrate 10. The second semiconductor layer SMC2 is formed of, for example, TAOS as an oxide semiconductor. The second semiconductor layer SMC2 includes a third region R3, a fourth region R4 and a second channel region RC2 located between the third region R3 and the fourth region R4. The second channel region RC2 includes a third main surface SU3 opposing the second gate electrode GE2 and a fourth main surface SU4 located at an opposite side of the third main surface SU3 and opposing the first light-shielding layer SH1.

The insulating layer 13 is further disposed between the second gate electrode GE2 and the second semiconductor layer SMC2. The insulating layer 14 is further disposed above the first light-shielding layer SH1, the second gate electrode GE2 and the second semiconductor layer SMC2.

The third electrode E3 is disposed on the insulating layer 14. The third electrode E3 passes through a fourth contact hole CH4 penetrating at least the insulating layer 14 and located in a region opposing the third region R3, and is electrically connected to the third region R3. In the embodiment, the fourth contact hole CH4 penetrates the insulating layer 13 and the insulating layer 14.

The fourth electrode E4 is disposed on the insulating layer 14. The fourth electrode E4 passes through a fifth contact hole CH5 penetrating at least the insulating layer 14 and located in a region opposing the fourth region R4, and is electrically connected to the fourth region R4. In the embodiment, the fifth contact hole CH5 penetrates the insulating layer 13 and the insulating layer 14.

The first conductive layer CL1 covers the reset switch RS. The first conductive layer CL1 passes through a sixth contact hole CH6 penetrating at least the insulating layer 15 and located in a region opposing the fourth electrode E4, and is electrically connected to the fourth electrode E4. In the embodiment, the sixth contact hole CH6 penetrates only the insulating layer 15.

The second conductive layer CL2 passes through a seventh contact hole CH7 penetrating at least the insulating layer 15 and located in a region opposing the third electrode E3, and is electrically connected to the third electrode E3. In the embodiment, the seventh contact hole CH7 penetrates the insulating layer 15 and the insulating layer 16. Note that the first conductive layer CL1 comprises an opening OP which surrounds the seventh contact hole CH7.

Figure 6:
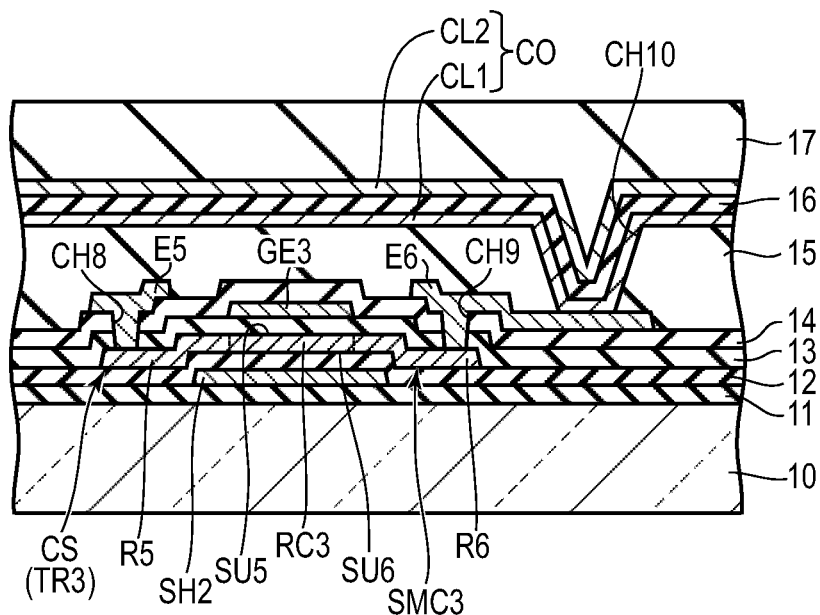
FIG. 6 is a cross-section showing the optical sensor device of FIG. 3, taken along a line VI-VI.

Next, a cross-sectional structure of each of the control switch CS and the capacitor CO will be described. FIG. 6 is a cross-section of the optical sensor device SD shown in FIG. 3, taken along a line VI-VI.

As shown in FIG. 6, above the insulating substrate 10, the control switch CS including the third gate electrode GE3, the third semiconductor layer SMC3, the fifth electrode E5 and the sixth electrode E6, is located. The control switch CS is constituted by the third thin film transistor TR3. Above the control switch CS, the capacitor CO is located.

The insulating layer 12 is further disposed between the second light-shielding layer SH2 and the third semiconductor layer SMC3. The third gate electrode GE3 is disposed above the insulating substrate 10. The third semiconductor layer SMC3 is formed of, for example, TAOS as an oxide semiconductor. The third semiconductor layer SMC3 includes a fifth region R5, a sixth region R6 and a third channel region RC3 located between the fifth region R5 and the sixth region R6. The third channel region RC3 includes a fifth main surface SU5 opposing the third gate electrode GE3 and a sixth main surface SU6 located at an opposite side of the fifth main surface SU5 and opposing the second light-shielding layer SH2.

The insulating layer 13 is further disposed between the third gate electrode GE3 and the third semiconductor layer SMC3. The insulating layer 14 is further disposed above the second light-shielding layer SH2, the third gate electrode GE3 and the third semiconductor layer SMC3.

The fifth electrode E5 is disposed on the insulating layer 14. The fifth electrode E5 passes through an eighth contact hole CH8 penetrating at least the insulating layer 14 and located in a region opposing the fifth region R5, and is electrically connected to the fifth region R5. In the embodiment, the eighth contact hole CH8 penetrates the insulating layer 13 and the insulating layer 14.

The sixth electrode E6 is disposed on the insulating layer 14. The sixth electrode E6 passes through a ninth contact hole CH9 penetrating at least the insulating layer 14 and located in a region opposing the sixth region R6, and is electrically connected to the sixth region R6. In the embodiment, the ninth contact hole CH9 penetrate the insulating layer 13 and the insulating layer 14.

The first conductive layer CL1 covers the control switch CS. The first conductive layer CL1 passes through a tenth contact hole CH10 penetrating at least the insulating layer 15 and located in a region opposing the sixth electrode E6, and is electrically connected to the sixth electrode E6. In the embodiment, the tenth contact hole CH10 penetrates only the insulating layer 15.

The optical sensor device SD of the embodiment is configured as described above.

Figure 7:
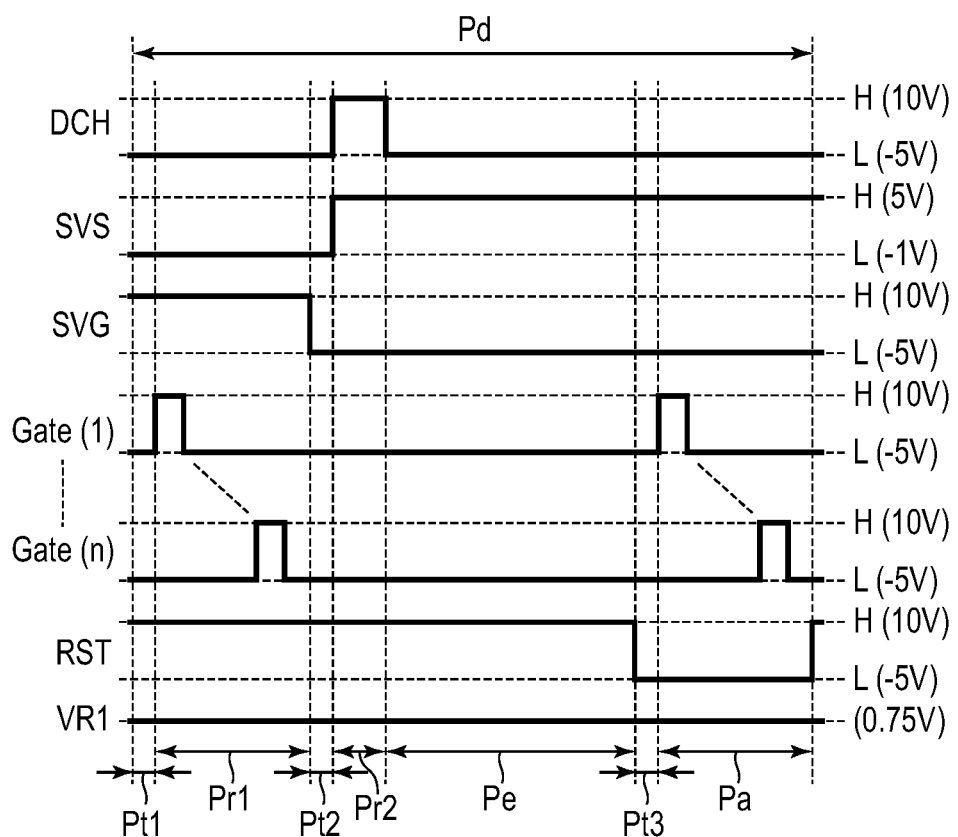
FIG. 7 is a timing chart showing signals applied to the above-described regions.

Next, a method of driving the optical sensor device SD of the embodiment will be described by illustrating an example thereof. FIG. 7 is a timing chart showing signals to be applied to the regions PX, respectively.

As shown in FIGS. 7 and 2, a period in which detection operation to detect an object in the detection area DA of the optical sensor panel SP is carried out once is defined as a detection period Pd. The detection period Pd includes a first transition period Pt1, a first reset period Pr1, a second transition period Pt2, a second reset period Pr2, an exposure period Pe, a third transition period Pt3 and a read period Pa.

First, in the first transition period Pt1, the control unit CN switches the level of the control signal SVS from an H (high) level to an L (low) level and the level of the control signal SVG from the L level to the H level. Thus, in the first transition period Pt1, the first electrode E1 of the optical sensor element SE changes to an L level (−1V) and the first gate electrode GE1 changes to an H level (10V). Note that the voltage value used in the embodiment is only an example and can be modified in various ways.

Subsequently, when shifted to the first reset period Pr1, the control unit CN applies control signals Gate (1), . . . , Gate (n) of an H level (10V) respectively to the gate lines G, and then switches the level of the control signals Gate (1), . . . , Gate (n), from the H level to an L level (−5V). The first reset period Pr1 includes a period after the level of the control signals Gate was switched from the H level to the L level, and therefore the potential of the third gate electrode GE3 of the control switch CS can be changed to substantially 10V.

In the embodiment, a plurality of gate lines G are driven for time division. More specifically, the level of the control signal Gate (1) applied to the gate line G1 is switched from the H level to the L level, and thereafter the level of the control signal Gate applied to the gate line G2 is switched from the L level to the H level. Then, the level of the control signal Gate applied to the gate line G2 is switched from the H level to the L level, and thereafter, the level of the control signal Gate applied to the gate line G3 is switched from the L level to the H level. Lastly, the level of the control signal Gate (n) applied to the gate line Gn is switched from the H level to the L level.

When the control signal Gate of the H level is applied via the respective gate line G corresponding to the respective one of the control switch CS, the control switch CS is turned on to apply a reset signal VR1 output from the power circuit PO via the respective selection switch SS and the respective source line S, to the optical sensor device SE. The control unit CN applies the reset signal VR1 to the optical sensor element SE from the power circuit PO via the source line S and the control switch CS. As the reset signal VR1 flows from the second electrode E2 of the optical sensor element SE to the first electrode E1 of the optical sensor element SE, the optical sensor device SE is reset.

After that, when shifted to the second transition period Pt2, the control unit CN switches the level of the control signal SVG from the H level to the L level. Thus, in the second transition period Pt2, the first gate electrode GE1 of the optical sensor element SE is changed to the L level, thereby turning off the optical sensor element SE.

Subsequently, when shifted to the second reset period Pr2, the control unit CN switches the level of the control signal DCH from an L level (−5V) to an H level (10V), and also the level of the control signal SVS from an L level to an H level. Thus, the reset switch RS is turned on to apply the reset signal VR1 to the first conductive layer CL1 and the second conductive layer CL2 via the third control wiring line WL3, thereby resetting the capacitor CO.

Next, when shifted to the exposure period Pe, the control unit CN switches the level of the control signal DCH from the H level to the L level. Thus, the reset switch RS is turned off. The optical sensor element SE controls the amount of the control signal SVS of the H level applied to the first electrode E1 via the first control wiring line WL1, to the first conductive layer CL1 according to the amount of the incident light to the first semiconductor layers SMC1. Here, the greater the amount of light made incident on the optical sensor element SE, the greater the amount of charge stored on the capacitor CO. Note that second semiconductor layer SMC2 of the reset switch RS is light-shielded by the first light-shielding layer SH1 and the third semiconductor layer SMC3 of the control switch CS is light-shielded by the second light-shielding layer SH2. Therefore, the reset switch RS and the control switch CS are in a dark condition at all times.

After that, when shifted to the third transition period Pt3, the control unit CN switches the level of the control signal RST from an H level (10V) to an L level (−5V). Thus, in the third transition period Pt3, the fourth thin film transistor TR4 is switched to an off state and the fifth thin film transistor TR5 is switched to an on state.

Then, when shifted to the read period Pa, the control unit CN, after applying the control signals Gate (1), . . . , Gate (n) of the H level to the respective gate lines G, switches the level of the control signals Gate (1), . . . , Gate (n) from the H level to the L level. Here, the read period Pa includes a period after the level of the control signals Gate is switched to the L level from the H level, the potential of the third gate electrode GE3 of the control switch CS is changed to substantially 10V.

The read period Pa of the embodiment, a plurality of gate lines G are driven by time division. When the control signals Gate of the H level are applied via the gate lines G corresponding to the respective control switches CS, the control switches CS are turned on. Thus, the capacitors CO discharge to the control circuit CC. Here, a current I flows to the control circuit CC from each capacitor CO. Note that in the read period Pa, a plurality of gate line G may be driven in a batch at the same time. Thus, the read period Pa can be shortened.

According to the optical sensor device SD of the embodiment, configured as described above, the optical sensor device SD comprises the insulating substrate 10, the regions PX arrayed in a matrix on the insulating substrate 10 and the first conductive layer CL1. The regions PX each comprises an optical sensor element SE, a reset switch RS and a control switch CS.

The optical sensor element SE, the reset switch RS and the control switch CS are each connected to the first conductive layer CL1 and they are covered by the first conductive layer CL1. With this configuration, the area for placing the optical sensor element SE, the reset switch RS and the control switch CS in the region PX can be increased.

The second conductive layer CL2 covers the first conductive layer CL1. Therefore, the capacitor CO can be formed using the first conductive layer CL1 and the second conductive layer CL2. The second conductive layer CL2 can avoid such a situation that the first conductive layer CL1 is affected by an adverse electrical effect from outside such as static electricity or the like.

As described above, a high-sensitivity optical sensor device SD can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the thin film transistor TR such as the first thin film transistor TR1 may not be a top-gate thin-film transistor, but a bottom-gate thin-film transistor. In this case, the second main surface SU2 of the first channel region RC1 of the first semiconductor layer SMC1 opposes the first conductive layer CL1. On the second main surface SU2, light transmitted through the first conductive layer CL1 and the like is made incident. The first conductive layer CL1 and the second conductive layer CL2 are light-transmissive, but the insulating substrate 10 need not necessarily be light-transmissive.

The locations of the first conductive layer CL1 and the second conductive layer CL2 in relation to each other may be reverse to that of the embodiment. In this case, the second conductive layer CL2 is located between the insulating substrate 10 and the first conductive layer CL1. In this case, the first conductive layer CL1 does not comprise an opening OP, and the second conductive layer CL2 comprises an opening to connect the first conductive layer CL1 to the third electrode E3 (the third control wiring line WL3).

The first light-shielding layer SH1 and the second light-shielding layer SH2 may be formed of an insulation material such as black resin or formed of a conductive material such a metal. When the light-shielding layer SH is formed of a metal, the light-shielding layer SH may be electrically floated. Or, the control signals Gate may be applied to the light-shielding layer SH as well to utilize the light-shielding layer SH as a gate electrode.

What is claimed is:

1. An optical sensor device comprising:
an insulating substrate;
an optical sensor element including a first gate electrode, a first semiconductor layer, a first electrode and a second electrode;
a first insulating layer disposed between the first gate electrode and the first semiconductor layer;
a second insulating layer disposed above the first gate electrode, the first semiconductor layer and the first insulating layer;
a third insulating layer disposed on the second insulating layer, the first electrode and the second electrode;
a first conductive layer covering the optical sensor element;
a second conductive layer opposing the first conductive layer;
a fourth insulating layer disposed between the first conductive layer and the second conductive layer;
a reset switch comprising a second thin film transistor including a second gate electrode, a second semiconductor layer, a third electrode and a fourth electrode;
a first light-shielding layer; and
a fifth insulating layer located between the first light-shielding layer and the second semiconductor layer,
the first gate electrode being formed above the insulating substrate,
the first semiconductor layer being formed of an oxide semiconductor and including a first region, a second region and a first channel region located between the first region and the second region,
the first channel region including a first main surface opposing the first gate electrode and a second main surface at an opposite side of the first main surface,
an electrical resistivity of the first channel region changing according to an amount of light received by the second main surface,
the first electrode being located on the second insulating layer, and electrically connected to the first region through a first contact hole penetrating the second insulating layer and located in a region opposing the first region,
the second electrode being located on the second insulating layer and electrically connected to the second region through a second contact hole penetrating the second insulating layer and located in a region opposing the second region,
the first conductive layer being disposed above the third insulating layer and electrically connected to the second electrode through a third contact hole penetrating the third insulating layer and located in a region opposing the second electrode,
the first conductive layer and the second conductive layer constituting a capacitor,
the optical sensor element controlling an amount of charge which is stored on the capacitor according to an amount of light received by the second main surface,
the second gate electrode being formed above the insulating substrate,
the second semiconductor layer being formed of an oxide semiconductor and including a third region, a fourth region and a second channel region located between the third region and the fourth region,
the second channel region including a third main surface opposing the second gate electrode and a fourth main surface located at an opposite side of the third main surface and opposing the first light-shielding layer,
the first insulating layer being disposed further between the second gate electrode and the second semiconductor layer,
the second insulating layer being further disposed above the first light-shielding layer, the second gate electrode and the second semiconductor layer,
the third electrode being disposed on the second insulating layer and being electrically connected to the third region through a fourth contact hole penetrating the second insulating layer and located in a region opposing to the third region,
the fourth electrode being disposed on the second insulating layer and being electrically connected to the fourth region through a fifth contact hole penetrating the second insulating layer and located in a region opposing the fourth region,
the first conductive layer covering the reset switch and being electrically connected to the fourth electrode through a sixth contact hole penetrating the third insulating layer and located in a region opposing to the fourth electrode,
the second conductive layer being electrically connected to the third electrode through a seventh contact hole penetrating the third insulating layer and located in a region opposing the third electrode,
the capacitor being reset by turning the reset switch on.

2. The device of claim 1, further comprising:
a control switch comprising a third thin film transistor including a third gate electrode, a third semiconductor layer, a fifth electrode and a sixth electrode; and
a second light-shielding layer,
wherein
the fifth insulating layer is located between the second light-shielding layer and the third semiconductor layer,
the third gate electrode is formed above the insulating substrate,
the third semiconductor layer is formed of an oxide semiconductor and includes a fifth region, a sixth region and a third channel region located between the fifth region and the sixth region,
the third channel region includes a fifth main surface opposing the third gate electrode and a sixth main surface located at an opposite side of the fifth main surface and opposing the second light-shielding layer,
the first insulating layer is disposed further between the third gate electrode and the third semiconductor layer,
the second insulating layer is further disposed above the second light-shielding layer, the third gate electrode and the third semiconductor layer,
the fifth electrode is disposed on the second insulating layer and electrically connected to the fifth region through an eighth contact hole penetrating the second insulating layer and located in a region opposing the fifth region,
the sixth electrode is disposed on the second insulating layer and electrically connected to the sixth region through a ninth contact hole penetrating the second insulating layer and located in a region opposing the sixth region, and
the first conductive layer covers the control switch and is electrically connected to the sixth electrode through a tenth contact hole penetrating the third insulating layer and located in a region opposing the sixth electrode, and the control switch switches between whether or not to apply a reset signal to the optical sensor element, or to discharge from the capacitor.

3. The device of claim 1, wherein
the first conductive layer is disposed between the third insulating layer and the second conductive layer.

4. The device of claim 1, wherein
the first conductive layer is formed of a transparent conductive material, and
the second conductive layer is formed of a transparent conductive material.

5. An optical sensor device comprising:
an insulating substrate;
a first conductive layer disposed above the insulating substrate;
an optical sensor element disposed between the insulating substrate and the first conductive layer, electrically connected to the first conductive layer, covered by the first conductive layer, including a first semiconductor layer formed of an oxide semiconductor, and controlling an amount of charge flowing to the first conductive layer according to an amount of incident light to the first semiconductor layer;
a capacitor including the first conductive layer and a second conductive layer opposing the first conductive layer;
a reset switch disposed between the insulating substrate and the first conductive layer, electrically connected to each of the first conductive layer and the second conductive layer, covered by the first conductive layer and including a second semiconductor layer formed of an oxide semiconductor, the reset switch resetting the capacitor when turned on; and
a control switch disposed between the insulating substrate and the first conductive layer, electrically connected to the first conductive layer, covered by the first conductive layer, including a third semiconductor layer formed of an oxide semiconductor, the control switch switching whether or not to apply a reset signal to the optical sensor element, or whether or not to discharge from the capacitor,
the optical sensor element controlling an amount of charge stored on the capacitor according to an amount of incident light.

6. An optical sensor device comprising:
an insulating substrate;
an optical sensor element including a first gate electrode, a first semiconductor layer, a first electrode and a second electrode;
a first insulating layer disposed between the first gate electrode and the first semiconductor layer;
a second insulating layer disposed above the first gate electrode, the first semiconductor layer and the first insulating layer;
a third insulating layer disposed on the second insulating layer, the first electrode and the second electrode;
a first conductive layer covering the optical sensor element;
a second conductive layer opposing the first conductive layer;
a fourth insulating layer disposed between the first conductive layer and the second conductive layer;
a control switch comprising a third thin film transistor including a third gate electrode, a third semiconductor layer, a fifth electrode and a sixth electrode;
a second light-shielding layer; and
a fifth insulating layer located between the second light-shielding layer and the third semiconductor layer,
the first gate electrode being formed above the insulating substrate,
the first semiconductor layer being formed of an oxide semiconductor and including a first region, a second region and a first channel region located between the first region and the second region,
the first channel region including a first main surface opposing the first gate electrode and a second main surface at an opposite side of the first main surface,
an electrical resistivity of the first channel region changing according to an amount of light received by the second main surface,
the first electrode being located on the second insulating layer, and electrically connected to the first region through a first contact hole penetrating the second insulating layer and located in a region opposing the first region,
the second electrode being located on the second insulating layer and electrically connected to the second region through a second contact hole penetrating the second insulating layer and located in a region opposing the second region,
the first conductive layer being disposed above the third insulating layer and electrically connected to the second electrode through a third contact hole penetrating the third insulating layer and located in a region opposing the second electrode,
the first conductive layer and the second conductive layer constituting a capacitor, the optical sensor element controlling an amount of charge which is stored on the capacitor according to an amount of light received by the second main surface,
the third gate electrode being formed above the insulating substrate,
the third semiconductor layer being formed of an oxide semiconductor and includes a fifth region, a sixth region and a third channel region located between the fifth region and the sixth region,
the third channel region including a fifth main surface opposing the third gate electrode and a sixth main surface located at an opposite side of the fifth main surface and opposing the second light-shielding layer,
the first insulating layer being disposed further between the third gate electrode and the third semiconductor layer,
the second insulating layer being further disposed above the second light-shielding layer, the third gate electrode and the third semiconductor layer,
the fifth electrode being disposed on the second insulating layer and electrically connected to the fifth region through an eighth contact hole penetrating the second insulating layer and located in a region opposing the fifth region,
the sixth electrode being disposed on the second insulating layer and electrically connected to the sixth region through a ninth contact hole penetrating the second insulating layer and located in a region opposing the sixth region, and
the first conductive layer covering the control switch and being electrically connected to the sixth electrode through a tenth contact hole penetrating the third insulating layer and located in a region opposing the sixth electrode, the control switch switching between whether or not to apply a reset signal to the optical sensor element, or to discharge from the capacitor.

7. The device of claim 6, wherein
the first conductive layer is disposed between the third insulating layer and the second conductive layer.

8. The device of claim 6, wherein
the first conductive layer is formed of a transparent conductive material, and
the second conductive layer is formed of a transparent conductive material.

\* \* \* \* \*